United States Patent [19]

Nagamatsu

[11] Patent Number: 4,733,365
[45] Date of Patent: Mar. 22, 1988

[54] LOGIC ARITHMETIC CIRCUIT

[75] Inventor: Masato Nagamatsu, Yokohama, Japan

[73] Assignee: Kabushiki Kaisha Toshiba, Kawasaki, Japan

[21] Appl. No.: 933,859

[22] Filed: Nov. 24, 1986

[30] Foreign Application Priority Data

Nov. 26, 1985 [JP] Japan .................... 60-265515

[51] Int. Cl.$^4$ .................................. G06F 7/50
[52] U.S. Cl. .................... 364/784; 364/200
[58] Field of Search ............. 364/784, 200 MS File, 364/900 MS File

[56] References Cited

U.S. PATENT DOCUMENTS

| | | | |
|---|---|---|---|
| 4,435,782 | 3/1984 | Kaufman | 364/784 |
| 4,449,197 | 5/1984 | Henry et al. | 364/784 |
| 4,559,609 | 12/1985 | Robinson | 364/784 |
| 4,564,921 | 1/1986 | Suganuma | 364/784 |
| 4,592,007 | 5/1986 | Ohhashi | 364/784 |
| 4,601,007 | 7/1986 | Uya et al. | 364/784 |
| 4,621,338 | 11/1986 | Uhlenhoff | 364/784 |
| 4,667,303 | 5/1987 | Pfennings | 364/784 |

OTHER PUBLICATIONS

Mavor, et al., "Random Logic," Introduction to MOS LSI Design, Chapter 4, Sec. 1.1, pp. 90-92 1983.

Primary Examiner—David Y. Eng
Attorney, Agent, or Firm—Finnegan, Henderson, Farabow, Garrett & Dunner

[57] ABSTRACT

A logic arithmetic circuit comprising first through sixth transistors, the first through third being P-channel transistors and the fourth through sixth being N-channel transistors. The gates of the first and sixth transistors are supplied by a synchronizing signal; the gates of the second and fifth are supplied by a first operand signal; and the gates of the third and fourth are supplied by a second operand signal. Respective current paths are provided between the first and the sixth transistors through the second and fourth transistors and through the third and fifth transistors with the output signal taken at the connecting point of the fourth and fifth transistors with the sixth transistor.

5 Claims, 15 Drawing Figures

F I G. 1 PRIOR ART
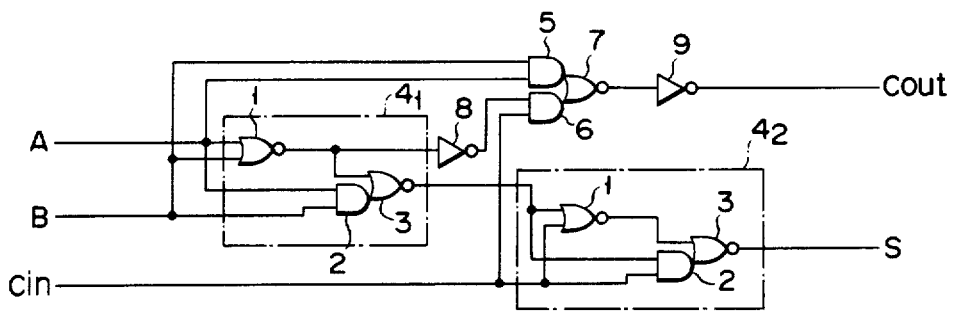
F I G. 2 PRIOR ART
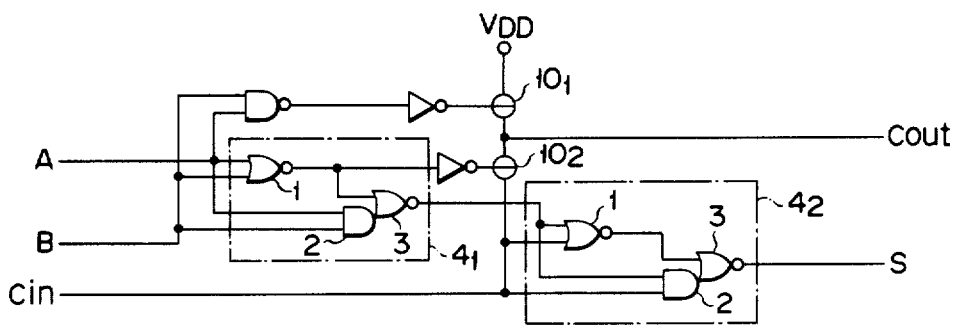
F I G. 3 PRIOR ART
| A | B | cin | S | Cout |
|---|---|-----|---|------|
| 0 | 0 | 0   | 0 | 0    |
| 1 | 0 | 0   | 1 | 0    |
| 0 | 1 | 0   | 1 | 0    |
| 1 | 1 | 0   | 0 | 1    |
| 0 | 0 | 1   | 1 | 0    |
| 1 | 0 | 1   | 0 | 1    |
| 0 | 1 | 1   | 0 | 1    |
| 1 | 1 | 1   | 1 | 1    |

F I G. 12
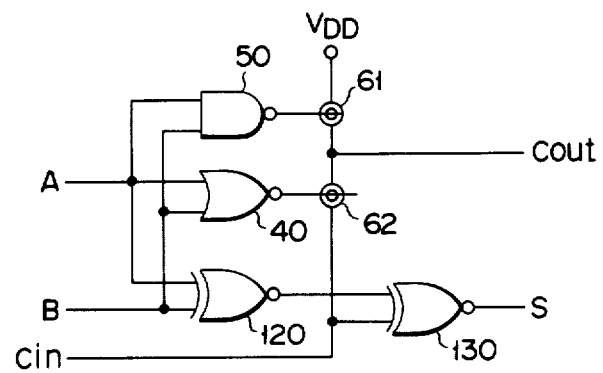
F I G. 13
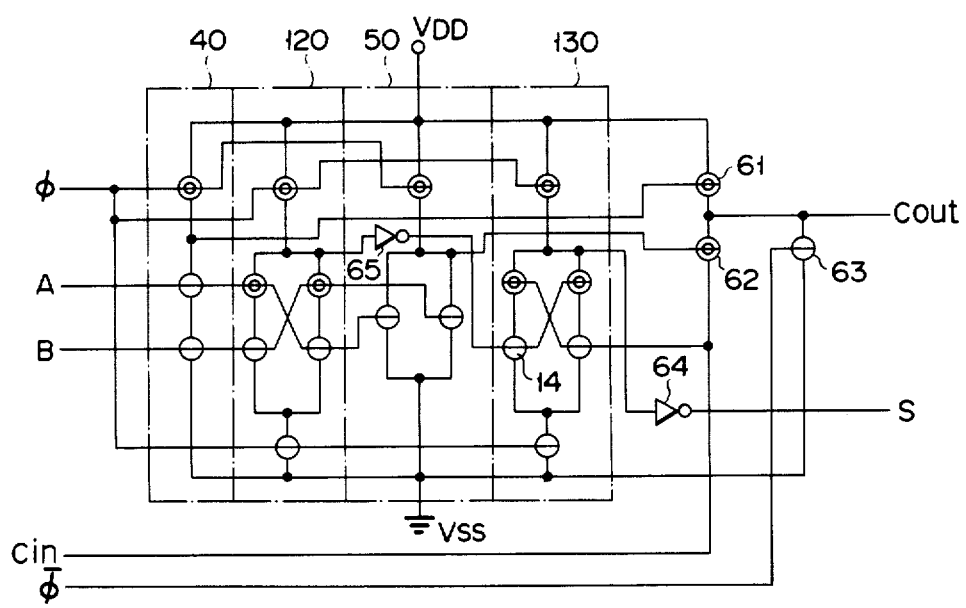

LOGIC ARITHMETIC CIRCUIT

BACKGROUND OF THE INVENTION

This invention relates to a logic arithmetic circuit which performs full-addition of binary numbers, and more particularly, to a reduction in the number of elements required to form a full-adder circuit.

In response to operand input signals A and B, and a carry signal Cin from the lower-order digit, a well-known binary full-adder circuit produces an operated output signal S and a carry signal Cout to a higher-order digit.

FIG. 1 shows a circuit diagram of a conventional full-adder circuit. This circuit comprises exclusive OR gates $4_1$ and $4_2$ including NOR gate 1, AND gate 2, and NOR gate 3. Operand input signals A and B are input to OR gate $4_1$. The output from exclusive OR gate $4_1$ and carry signal Cin from a lower-order digit are supplied to exclusive OR gate $4_2$. A signal from exclusive OR gate $4_2$ is output as an operated output signal.

The circuit including AND gates 5 and 6, NOR gate 7, and inverters 8 and 9, is a carry circuit. This carry circuit outputs carry signal Cout to a higher-order digit, according to carry signal Cin from a lower-order digit and operand input signals A and B.

FIG. 2 shows a circuit diagram of another conventional full-adder circuit. In this full-adder circuit, a so-called Manchester type carry circuit is used as its carry circuit. More specifically, this type of carry circuit comprises N-channel MOS transistors $10_1$ and $10_2$, which are connected in series between the high voltage $V_{DD}$ and carry signal Cin from a lower-order digit. In this circuit, MOS transistors $10_1$ and $10_2$ are controlled according to signals A, B, and Cin, so that the logic level of carry signal Cout to a higher-order digit is controlled. The junction of transistors $10_1$ and $10_2$ provides the output terminal for carry signal Cout to a higher-order digit.

In a conventional circuit thus arranged, operated output signal S and carry signal Cout can be expressed as follows, using operand input signals A and B, and carry signal Cin:

$$S = A \cdot B \cdot Cin + A \cdot \bar{B} \cdot \overline{Cin} + \bar{A} \cdot B \cdot \overline{Cin} + \bar{A} \cdot \bar{B} \cdot Cin \quad (1)$$

$$Cout = A \cdot B + \bar{A} \cdot B \cdot Cin + A \cdot \bar{B} \cdot Cin \quad (2)$$

These formulas (1) and (2) are tabulated into the truth table shown in FIG. 3.

The MOS type integrated circuit (abbreviated MOS-IC), now widely used, has been continuously improved, and this has resulted in a remarkable increase in its integration density. The requirements for a MOS-IC circuit design are as follows:

The first requirement is how to realize a system having a logical function, and having the smallest possible number of elements, such as transistors.

The second requirement is how to realize high speed operation and, at the same time low power consumption.

Of these two requirements, the latter, viz., high speed operation and low power consumption, has been realized to a certain degree, by arranging the circuit with CMOSs, and making them dynamic-operated.

As for the former, viz., reduction of the number of elements, no effective way to achieve this has been discovered so far. To give some examples, if a conventional circuit is arranged as shown in FIGS. 1 and 2, sixteen P-channel MOS transistors and sixteen N-channel MOS transistors are required for the FIG. 1 circuit, that is, the FIG. 1 circuit requires a total of thirty-two elements. For the FIG. 2 circuit, fourteen P-channel MOS transistors and sixteen N-channel MOS transistors are required. The number of elements required for this circuit is, therefore, thirty in total. Thus, conventional circuits require numerous elements.

SUMMARY OF THE INVENTION

Accordingly, an object of this invention is to provide a logic arithmetic circuit which can realize a reduction in the number of required elements.

To achieve the above object, a logic arithmetic circuit according to this invention employs, for its operation system, a dynamic synchronization system which synchronizes with a clock signal. The arrangement of an exclusive OR gate, as an essential element, will be outlined. The first terminal of a first transistor of first polarity type is connected to a high potential. The gate of the first transistor is supplied with a synchronization signal. The first terminals of the second and third transistors, both of first polarity, are connected to the second terminal of the first transistor. The gates of the second and third transistors are supplied with first and second signals, respectively. The first terminal of a fourth transistor, of second polarity, is connected to the second terminal of the second transistor. The gate of the fourth transistor is supplied with the second signal. The first terminal of a fifth transistor, of second polarity, is connected to the second terminal of the third transistor. The second terminal of the fifth transistor is connected to the second terminal of the fourth transistor. The gate of the fifth transistor is supplied with the first signal. The first terminal of a sixth transistor, of second polarity, is connected to a low potential, and the second terminal of the fifth transistor is connected to the junction of the second terminals of the fourth and fifth transistors. The gate of the six transistor is supplied with the synchronization signal. An output signal is obtained at the second terminal of the first transistor or at the second terminal of the sixth transistor.

According to the present invention, there is provided a logic arithmetic circuit comprising a first transistor of a first polarity type whose control terminal is supplied with a synchronizing signal, one terminal of an output current path of said first transistor being connected to a high potential; second and third transistors of said first polarity type, whose control terminals are supplied with first and second operand signals, respectively, one terminal of an output current path of each of said second and third transistors being connected to the other terminal of said output current path of said first transistor; a fourth transistor, of a second polarity type, whose control terminal is supplied with said second signal, one terminal of an output current path of said fourth transistor being connected to the other terminal of said output current path of said second transistor; a fifth transistor, of said second polarity type, whose control terminal is supplied with said first signal, one terminal of the output current path of said firth transistor being connected to the other terminal of said output current path of said third transistor, and the other terminal of said output current path of said fifth transistor being connected to the other terminal of said output current path of said fourth transistor; a sixth transistor, of said second polarity type, whose control terminal is supplied with said synchronizing signal, one terminal of an output current path of said sixth transistor being connected to a low potential, and the other terminal of said output current path of said sixth transistor being connected to said other terminals of said output current paths of said fourth and sixth transistors, and an output terminal, for providing an output signal, connected to one of said one terminal of said output current path of said fifth transistor and said other terminal of said output current path of said first transistor.

According to the present invention, there is further provided a logic arithmetic circuit comprising a first exclusive OR gate circuit, a second exclusive OR gate circuit, a NAND gate circuit, a NOR gate circuit, a further logic circuit, arithmetic output means for providing an arithmetic output signal, and carry output means for providing a carry signal to a higher-order digit, in which said first exclusive OR gate circuit comprises a first transistor of a first polarity type whose control terminal is supplied with a first synchronizing signal, one terminal of an output current path of said first transistor being connected to a high potential; second and third transistors of said first polarity type whose control terminals are supplied with first and second operand signals, respectively, one terminal of an output current path of each of said second and third transistors being connected to the other terminal of said output current path of said first transistor; a fourth transistor, of a second polarity type, whose control terminal is supplied with said second signal, one terminal of an output current path of said fourth transistor being connected to the other terminal of said output current path of said second transistor; a fifth transistor, of said second polarity type, whose control terminal is supplied with said first signal, one terminal of the output current path of said fifth transistor being connected to the other terminal of said output current path of said third transistor, and the other terminal of said output current path of said fifth transistor being connected to the other terminal of said output current path of said fourth transistor; a sixth transistor, of said second polarity type, whose control terminal is supplied with said first synchronizing signal, one terminal of an output current path of said sixth transistor being connected to a low potential, and the other terminal of said output current path of said sixth transistor being connected to said other terminals of said output current paths of said fourth and sixth transistors, and an output terminal for providing an output signal connected to the other terminal of said output current path of said sixth transistor; said second exclusive OR gate circuit comprises a seventh transistor, of a first polarity type, whose control terminal is supplied with said first synchronizing signal, one terminal of an output current path of said seventh transistor being connected to said high potential; eighth and ninth transistors, of said first polarity type, whose control terminals are supplied with a carry signal from a lower-order digit and an output signal of said first exclusive OR gate circuit, respectively, one terminal of an output current path of each of said eighth and ninth transistors being connected to the other terminal of said output current path of said seventh transistor; a tenth transistor, of said second polarity type, whose control terminal is supplied with said output signal of said first exclusive OR gate circuit, one terminal of an output current path of said tenth transistor being connected to the other terminal of said output current path of said eighth transistor; an eleventh transistor, of said second polarity type, whose control terminal is supplied with said carry signal from said lower-order digit, one terminal of the output current path of said eleventh transistor being connected to the other terminal of said output current path of said ninth transistor, and the other terminal of said output current path of said eleventh transistor being connected to the other terminal of said output current path of said tenth transistor; a twelfth transistor, of said second polarity type, whose control terminal is supplied with said first synchronizing signal, one terminal of an output current path of said twelfth transistor being connected to said low potential, and the other terminal of said output current path of said twelfth transistor being connected to said other terminals of said output current paths of said tenth and eleventh transistors, and an output terminal for providing an output signal connected to the other terminal of said output current path of said twelfth transistor, said output terminal being connected to said arithmetic output; said NAND gate circuit comprises a thirteenth transistor, of said first polarity type, whose control terminal is supplied with a second synchronizing signal having a phase opposite to that of said first synchronizing signal, one terminal of an output current path of said thirteenth transistor being connected to said high potential; a fourteenth transistor, of said second polarity type, whose control terminal is supplied with said first operand signal, one terminal of an output current path of said fourteenth transistor being connected to the other terminal of said output current path of said thirteenth transistor; a fifteenth transistor, of said second polarity type, whose control terminal is supplied with said second operand signal, one terminal of an output current path of said fifteenth transistor being connected to the other terminal of said output current path of said fourteenth transistor, and the other terminal of said output current path of said fifteenth transistor being connected to said low potential, and an output terminal for providing an output signal connected to the other terminal of said output current path of said thirteenth transistor; said NOR gate circuit comprises a sixteenth transistor, of said first polarity type, whose control terminal is supplied with said second synchronizing signal, one terminal of an output current path of said sixteenth transistor being connected to said high potential; seventeenth and eighteenth transistors, of said second polarity type, whose control terminals are supplied with said first and second operand signals, respectively, one terminal of an output current path of each of said seventeenth and eighteenth transistors being connected to the other terminal of said output current path of said sixteenth transistor, the other terminal of said output current path of each of said seventeenth and eighteenth transistors being connected to said low potential, and an output terminal for providing an output signal connected to the other terminal of said output current path of said sixteenth transistor; said further logic circuit comprises a nineteenth transistor, of said first polarity type, whose control terminal is supplied with said output signal of said NAND gate circuit, one terminal of an output current path of said nineteenth transistor being connected to said high potential; a twentieth transistor, of said first polarity type, whose control terminal is supplied with said output signal of said NOR gate circuit, one terminal of an output current path of said twentieth transistor being connected to the other terminal of said output current path of said nineteenth transistor, the other terminal of said output current path of said twentieth transistor being connected to said carry signal from said lower-order digit; and a twenty-first transistor, of said second polarity type, whose control terminal is supplied with said second synchronizing signal, one terminal of an output current path of said twenty-first transistor being connected to the node of said eighteenth transistor and said nineteenth transistor, the other terminal of said output current path of said twenty-first transistor being connected to said low potential, said node of said eighteenth transistor and said nineteenth transistor being connected to said carry output means.

By employing a dynamic synchronization circuit thus arranged, a reduction in the number of transistors used can be realized, and therefore, a reduction in the number of elements in the complete circuit can also be realized.

BREIF DESCRIPTION OF THE DRAWINGS

FIG. 1 is a circuit diagram of a conventional arithmetic circuit;

FIG. 2 is a circuit diagram of another conventional arithmetic circuit;

FIG. 3 shows a truth table for the arithmetic circuit shown in FIG. 2;

FIG. 12 shows a circuit diagram of equivalent to the circuit shown in FIG. 11; and FIGS. 13 to 15 are circuit diagrams of yet other modifications of the logic arithmetic circuit according to the present invention, which correspond to those of FIGS. 7 to 9, respectively.

DETAILED DESCRIPTION OF THE PREFERRED EMBODIMENTS

Figure 4:
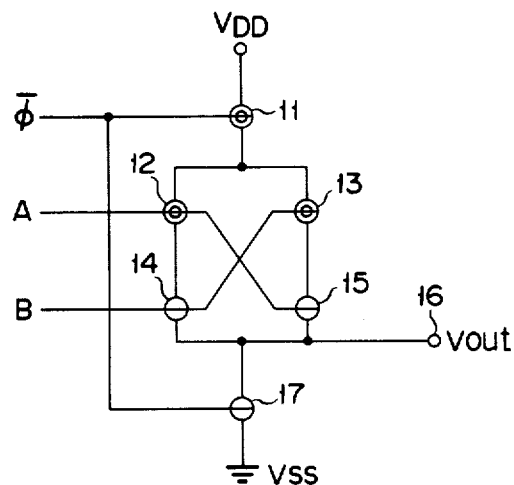
FIG. 4 is a logic arithmetic circuit of an embodiment according to this invention.

An embodiment of the logic arithmetic circuit according to the present invention will now be described, with reference to the accompanying drawings. FIG. 4 is a circuit diagram of an exclusive OR circuit of a logic arithmetic circuit according to the present invention. High potential $V_{DD}$ is connected to the first terminal of P-channel MOS transistor 11. The gate of transistor 11 is supplied with clock signal $\bar{\phi}$ as a synchronization signal. The second terminal of transistor 11 is connected to the first terminal of P-channel MOS transistor 12. The gate of transistor 12 is supplied with operand input signal A. The second terminal of transistor 11 is also connected to the first terminal of P-channel MOS transistor 13. The gate of transistor 13 is supplied with operand input signal B. The second terminal of transistor 12 is connected to the first terminal of N-channel MOS transistor 14. The gate of transistor 14 is supplied with operand input signal B. The second terminal of transistor 13 is connected to the first terminal of N-channel MOS transistor 15. The gate of transistor 15 is supplied with operand input signal A. The second terminals of N-channel transistors 14 and 15 are both connected to output terminal 16. Inserted between output terminal 16 and low potential $V_{SS}$ is N-channel MOS transistor 17. The gate of transistor 17 is supplied with clock signal $\phi$.

In an exclusive OR circuit thus-arranged, by repeatedly reversing the polarity of clock signal $\phi$, the operation mode and the precharge mode can be alternately selected. More specifically, when clock signal $\bar{\phi}$ is logical "1", the circuit is in the precharge mode. In this mode, transistor 17 is turned on, and output signal Vout will be logical "0". When clock signal $\bar{\phi}$ is logical "0", the circuit is in the operation mode, and transistor 11 is turned on. Depending on the levels of input signals A and B during this period, transistors 12 to 15 will be either turned on or off, and the level of output signal Vout is detected. To be more precise, when both input signals A and B are either logical "1" or logical "0", either of transistors 12 or 14, both of which are inserted in series between transistor 11 and output terminal 16, will be turned off. Likewise, either of transistors 13 or 15, both of which are inserted in series between transistor 11 and output terminal 16, will be turned off. Because of the turning off of two transistors, output signal Vout becomes logical "0". Conversely, when one of input signals A and B is logical "1" and the other is logical "0", either transistors 12 and 14 or transistors 13 and 15 will be turned on. Because of the turn-on of two transistors, output signal Vout becomes logical "1". Thus, in this circuit, output signal Vout is the exclusive OR signal of input signals A and B. All of the transistors mentioned above are of enhancement type.

Figure 5:
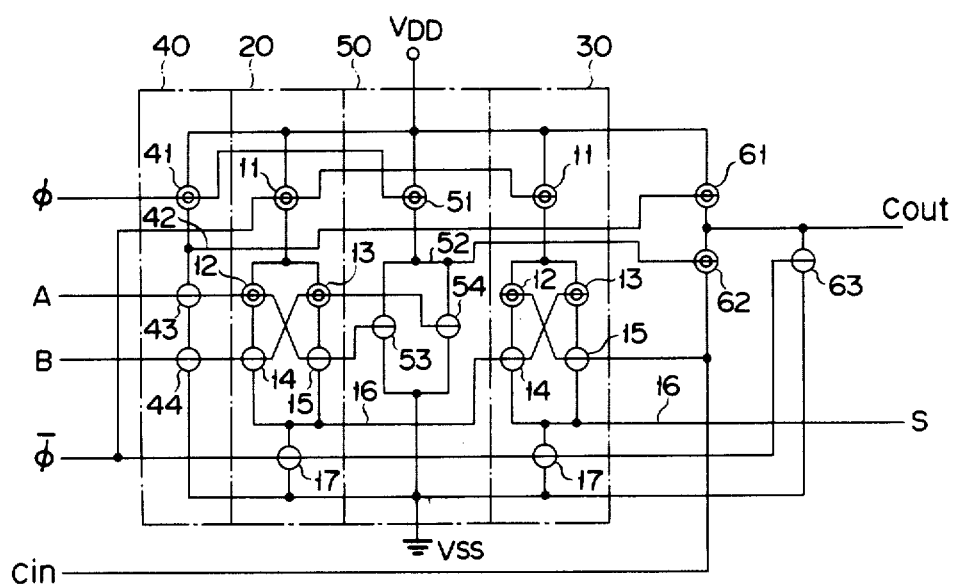
FIG. 5 is a logic arithmetic circuit of another embodiment according to this invention, which includes the logic arithmetic circuit shown in FIG. 4.

FIG. 5 is a circuit diagram of a full-adder circuit arranged using the exclusive OR circuit shown in FIG. 4. In FIG. 5, reference numeral 20 is the exclusive OR circuit as shown in FIG. 4. This circuit is supplied with operand input signals A and B. Numeral 30 is the exclusive OR circuit arranged in the same manner as that of FIG. 4. This circuit is supplied with carry signal Cin from a lower-order digit and the output signal from exclusive OR circuit 20.

Numeral 40 is a dynamic type NAND gate circuit. In circuit 40, high potential $V_{DD}$ is connected to the first terminal of P-channel MOS transistor 41. The gate of transistor 41 is supplied with clock signal $\phi$, which is reverse in phase with respect to clock signal $\bar{\phi}$, as a synchronization signal. The second terminal of transistor 41 serves as output terminal 42. Output terminal 42 is connected to the first terminal of N-channel MOS transistor 43. The gate of transistor 43 is supplied with operand input signal A. The second terminal of transistor 43 is connected to the first terminal of N-channel MOS transistor 44. The gate of transistor 44 is supplied with operand input signal B. The second terminal of transistor 44 is connected to low potential $V_{SS}$.

In exclusive OR circuit 20, high potential $V_{DD}$ is connected to the first terminal of P-channel MOS transistor 11. The gate of transistor 11 is supplied with clock signal $\bar{\phi}$ as a synchronization signal. The second terminal of transistor 11 is connected to the first terminal of P-channel MOS transistor 12. The gate of transistor 12 is supplied with operand input signal A. The second terminal of transistor 11 is also connected to the first terminal of P-channel MOS transistor 13. The gate of transistor 13 is supplied with operand input signal B. The second terminal of transistor 12 is connected to the first terminal of N-channel MOS transistor 14. The gate of transistor 14 is supplied with operand input signal B. The second terminal of transistor 13 is connected to the first terminal of N-channel MOS transistor 15. The gate of transistor 15 is supplied with operand input signal A. The second terminals of N-channel transistors 14 and 15 are both connected to output terminal 16 of exclusive OR circuit 20. Inserted between output terminal 16 and low potential $V_{SS}$ is N-channel MOS transistor 17. The gate of transistor 17 is supplied with clock signal $\bar{\phi}$.

Numeral 50 is a dynamic type NOR gate circuit. In NOR gate circuit 50, high potential $V_{DD}$ is connected to the first terminal of P-channel MOS transistor 51. The gate of transistor 51 is supplied with clock signal $\phi$ as a synchronization signal. The second terminal of transistor 51 serves as output terminal 52. Output terminal 52 is connected to the first terminals of two N-channel MOS transistors 53 and 54. Of those transistors, the gate of transistor 53 is supplied with operand input signal A, and the gate of transistor 54 is supplied with operand input signal B. The second terminals of transistors 53 and 54 are both connected to low potential $V_{SS}$.

In exclusive OR circuit 30, high potential $V_{DD}$ is connected to the first terminal of P-channel MOS transistor 11. The gate of transistor 11 is supplied with clock signal $\bar{\phi}$ as a synchronization signal. The second terminal of transistor 11 is connected to the first terminal of P-channel MOS transistor 12. The gate of transistor 12 is supplied with carry signal Cin from a lower-order digit. The second terminal of transistor 11 is also connected to the first terminal of P-channel MOS transistor 13. The gate of transistor 13 is supplied with an output signal of exclusive OR circuit 20. The second terminal of transistor 12 is connected to the first terminal of N-channel MOS transistor 14. The gate of transistor 14 is supplied with an output signal of exclusive OR circuit 20. The second terminal of transistor 13 is connected to the first terminal of N-channel MOS transistor 15. The gate of transistor 15 is supplied with carry signal Cin from a lower-order digit. The second terminals of N-channel transistors 14 and 15 are both connected to output terminal 16 of exclusive OR circuit 30. Output terminal 16 of exclusive OR circuit 30 forms an output terminal of the complete circuit of FIG. 5 where output signal S is provided. Inserted between output terminal 16 and low potential $V_{SS}$ is N-channel MOS transistor 17. The gate of transistor 17 is supplied with clock signal $\phi$.

Figure 6:
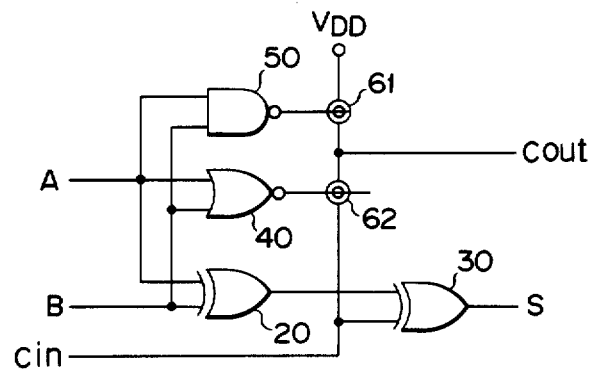
FIG. 6 is a circuit equivalent to the logic arithmetic circuit shown in FIG. 5.

P-channel MOS transistor 61 is inserted between $V_{DD}$ and carry signal Cout to a higher-order digit. The gate of transistor 61 is supplied with the signal of output terminal 42 of NAND gate circuit 40. P-channel MOS transistor 62 is inserted between carry signal Cout and carry signal Cin from a lower-order digit. The gate of transistor 62 is supplied with the signal of output terminal 52 of NOR gate circuit 50. N-channel MOS transistor 63 is inserted between carry signal Cout and $V_{SS}$. The gate of transistor 63 is supplied with clock signal $\bar{\phi}$. A circuit equivalent to the FIG. 5 circuit thus-arranged will be shown in FIG. 6. All of the transistors employed in the FIG. 5 circuit are of enhancement type. Operand input signals A and B are respectively applied to the two input terminals of each of NAND gate circuit 40, NOR gate circuit 50, and exclusive OR gate circuit 20.

The output signal of NAND gate circuit 40 is input to the gate of transistor 61. The output signal of NOR gate circuit 50 is input to the gate of transistor 62. The output signal of exclusive OR gate circuit 20 is input to the first input terminal of exclusive OR gate circuit 30. Carry signal Cin from a lower-order digit is input to the other input terminal of exclusive OR gate circuit 30. The output signal of exclusive OR gate circuit 30 serves as operated output signal S.

In the circuit shown in FIG. 5, when clock signal $\bar{\phi}$ is logical "1" in the two exclusive OR circuits 20 and 30, the transistor 17 in each of the exclusive OR circuits 20 and 30 is turned on, and the exclusive OR circuits are thus set up in the precharge mode. At this time, the signals at the output terminals 16 of the exclusive OR circuits 20 and 30 are logical "1". Accordingly, the calculated output signal S at the output terminal of the arithmetic circuit is logical "1". When clock signal $\bar{\phi}$ is logical "1" and signal $\phi$ is logical "0", transistor 41 in NAND gate circuit 40 and transistor 51 in NOR gate circuit 50 are also turned on, and the precharge mode is set up. Then, output terminals 42 and 52 are both in $V_{DD}$ level, i.e. logical "1". As a result, transistors 61 and 62 are both turned off. N-channel transistor 63, whose gate is supplied with logical "1" clock signal $\bar{\phi}$, is turned on, so that carry signal Cout to the higher-order digit, is also logical "0".

Conversely when clock signal $\bar{\phi}$ is logical "0" and clock signal $\phi$ is logical "1", the circuit is in the operation mode. In this mode, output terminal 42 in NAND gate circuit 40 and output terminal 52 in NOR gate circuit 50 respectively, having been precharged to logical "1", are discharged to become logical "0" or are not discharged, to thereby remain at logical "1", according to the logical levels of operand signals A and B. In this operational manner, a NAND logical signal of operand input signals A and B is output from output terminal 42, and a NOR logical signal of operand input signals A and B is output from output terminal 52.

When clock signal $\bar{\phi}$ is logical "0", the transistors 11 of exclusive OR circuits 20 and 30 are turned on. In circuit 20, the signal resulting from exclusively ORing operand input signals A and B appears at the output terminal 16 of circuit 20. In exclusive OR circuit 30, the signal at the output terminal 16 of circuit 20 and the carry signal Cin from the lower-order digit, are exclusively ORed, and the result thereof appears at the output terminal 16 of circuit 30. This signal at the output terminal 16 of exclusive OR circuit 30 is used as the operated output signal S.

The carry signal Cout to the higher-order digit, being precharged to $V_{SS}$ via N-channel MOS transistor 63, is set to either logical "1" or "0". This level-setting is performed by turning on or off P-channel MOS transistors 61 and 62, according to the output signals of NAND gate circuit 40 and NOR gate circuit 50.

While in the operation mode, when operand input signals A and B and carry signal Cin are all logical "1", the output signal of exclusive OR circuit 20 is logical "0". At this time, the calculated output signal S of exclusive OR circuit 30, which is supplied with the logical "0" output signal of exclusive OR circuit 20 and the carry signal Cin, is logical "1". The output signals of NAND gate circuit 40 and NOR gate circuit 50 are both logical "0". As a result, P-channel MOS transistors 61 and 62 are turned on, and the carry signal Cout is logical "1". This state is illustrated in the bottom line of the truth table of FIG. 3. Thus, the FIG. 5 circuit produces the operated output signal S and the carry signal Cout to the higher-order digit, according to the logical states of operand input signals A and B and the carry signal Cin, as is shown in the truth table.

As can be seen from the foregoing, the circuit of FIG. 5 operates as a binary full-adder circuit. The elements used in this circuit are 10 P-channel transistors, and 11 N-channel transistors, giving a total of 21 elements. As has been described above, the FIG. 1 and FIG. 2 circuits of the prior art devices require 32 and 30 elements respectively, while the circuit of the present invention requires only 21 elements. It can be clearly seen from this that a saving of approximately 30% in the number of circuit elements is attainable in the above-mentioned embodiment.

Figure 7:
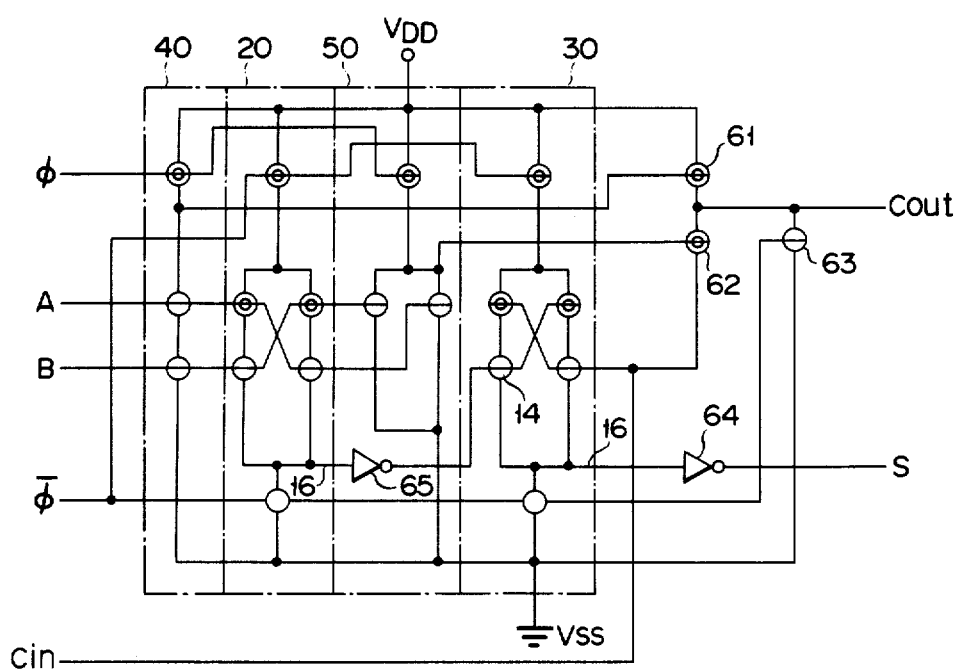
FIG. 7 is a circuit diagram illustrating a modification of the logic arithmetic circuit shown in FIG. 4.

FIG. 7 shows a modificaion of the FIG. 5 embodiment. In this embodiment, in order to improve the load drive ability of the calculated output signal S, inverter 64 is inserted between the output terminal 16 of exclusive OR circuit 30 and the calculated output signal S. By using the inverter, the logical level of signal S is the inverse of that of FIG. 5. To eliminate the difference in the logical levels of signal S, inverter 65 is inserted between the output terminal 16 of exclusive OR circuit 20 and the gate of transistor 14 of exclusive OR circuit 30. This modification requires four transistors more than those of the FIG. 5 embodiment. The number of transistors used is, however, still much smaller than in the prior art. In this embodiment, the same numerals are used for designating corresponding portions in FIG. 5.

Figure 8:
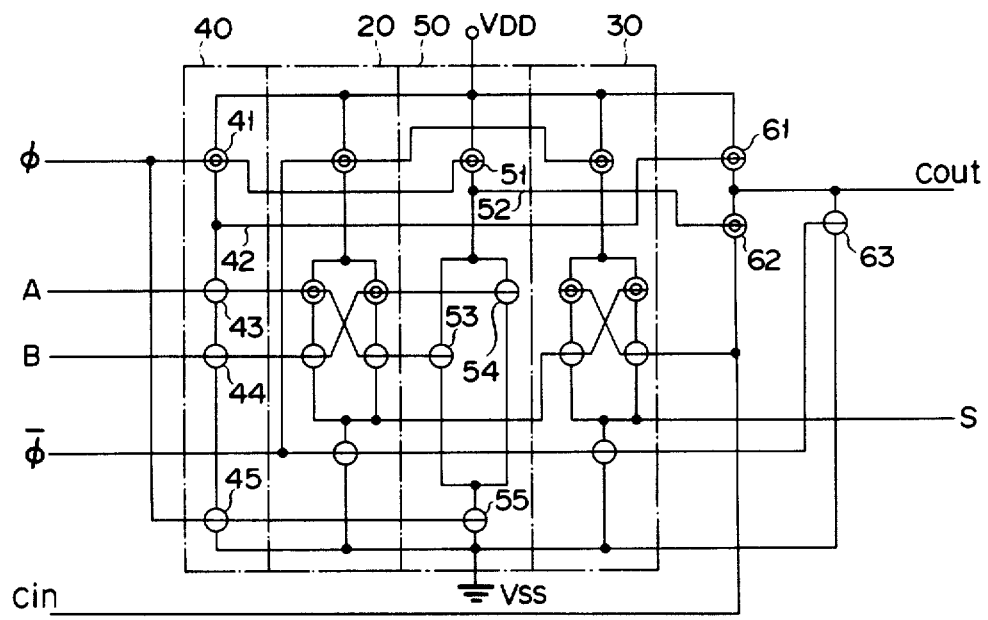
FIGS. 8 and 9 are circuit diagrams, each illustrating other modifications of the logic arithmetic circuit according to the present invention.

FIG. 8 shows another modification of the FIG. 5 circuit. In this modification, N-channel MOS transistors 45 and 55 are provided. Specifically, MOS transistor 45 is inserted between transistor 44 of NAND gate circuit 40 and $V_{SS}$, and MOS transistor 55 is inserted between transistors 53 and 54 of NOR gate circuit 50, on the one hand, and $V_{SS}$, on the other hand. Clock signal $\phi$ is applied to the gates of these transistors.

With such an arrangement, in gate circuits 40 and 50, during a period in which transistors 41 and 51 are turned on, and output terminals 42 and 52 are precharged, transistors 45 and 55 are placed in the off state. Therefore, even if operand input signals A and B are set at any level during this precharge period, DC current never flows between potentials $V_{DD}$ and $V_{SS}$. This modification requires two transistors more than in the FIG. 5 embodiment. It should be noted, however, that a large reduction in power consumption can be attained in this embodiment. In this embodiment, the same numerals are used for designating corresponding portions in FIG. 5.

Figure 9:
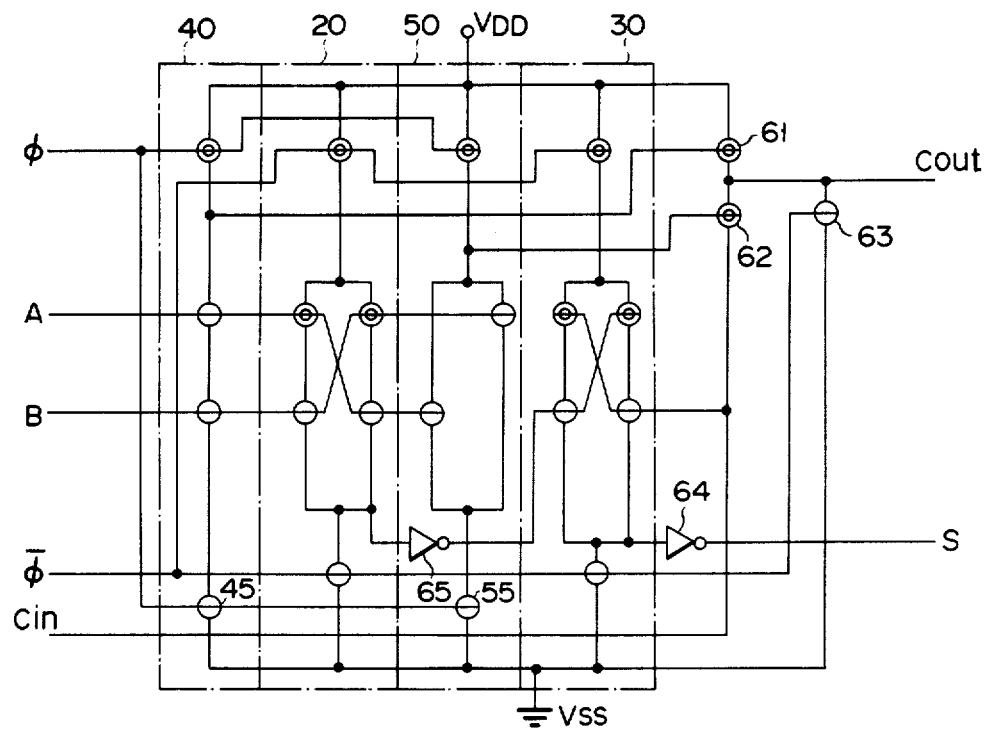

Yet another modification of the FIG. 5 circuit is shown in FIG. 9. In this modification, inverters 64 and 65 of the FIG. 7 embodiment and N-channel MOS transistors 45 and 55 of the FIG. 8 embodiment are applied to the FIG. 5 embodiment. This embodiment requires an increased number of elements, but attains the effects of both the FIG. 7 and the FIG. 8 embodiments. In this embodiment, the same numerals are used for designating corresponding portions in FIG. 5.

Figure 10:
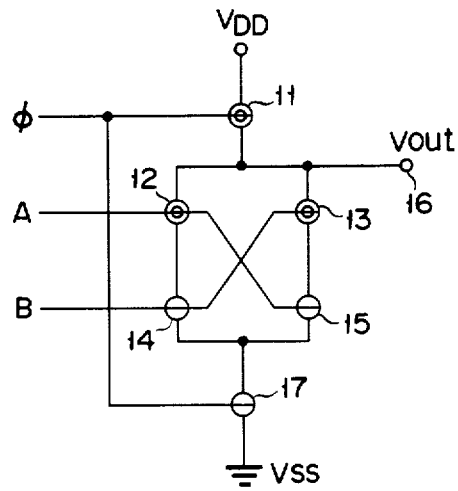
FIG. 10 is a circuit diagram of another embodiment of a logic arithmetic circuit according to the present invention, which corresponds to the logic arithmetic circuit shown in FIG. 4.

FIG. 10 shows an exclusive NOR circuit, used in a synchronizing arithmetic circuit according to the present invention, which corresponds to the FIG. 4 circuit. The major difference between this exclusive OR circuit and the FIG. 4 circuit resides in the fact that output terminal 16 is provided at the second terminal side ($V_{DD}$ side) of P-channel MOS transistor 11.

In the exclusive NOR circuit of FIG. 10, high potential $V_{DD}$ is connected to the first terminal of P-channel MOS transistor 11. The gate of transistor 11 is supplied with clock signal $\phi$ as a synchronization signal. The second terminal of transistor 11 is connected to the first terminal of P-channel MOS transistor 12. The gate of transistor 12 is supplied with operand input signal A. The second terminal of transistor 11 is also connected to the first terminal of P-channel MOS transistor 13. The gate of transistor 13 is supplied with operand input signal B. The second terminal of transistor 12 is connected to the first terminal of N-channel MOS transistor 14. The gate of transistor 14 is supplied with operand input signal B. The second terminal of transistor 13 is connected to the first terminal of N-channel MOS transistor 15. The gate of transistor 15 is supplied with operand input signal A. The first terminals of P-channel transistors 12 and 13 are both connected to output terminal 16. Inserted between the second terminals of N-channel transistors 14 and 15, on the one hand, and low potential $V_{SS}$, on the other hand, is N-channel MOS transistor 17. The gate of transistor 17 is supplied with clock signal $\phi$.

In an exclusive NOR circuit thus-arranged, by repeatedly reversing the polarity of clock signal $\phi$, the operation mode and the precharge mode are alternately selected. More specifically, when clock signal $\phi$ is logical "0", this circuit is in the precharge mode. When in this mode, transistor 17 is turned off. When clock signal $\phi$ is logical "1", this circuit is in the operation mode, and transistor 11 is turned on. Depending on the levels of input signals A and B during this period, transistors 12 to 15 will be either turned on or off, and the level of output signal Vout can be detected. To be more precise, when both input signals A and B are either logical "1" or logical "0", either transistors 12 or 14, both of which are inserted in series between transistor 11 and transistor 17, will be turned off. Likewise, either transistor 13 or 15, both of which are inserted in series between transistor 11 and transistor 17, will be turned off. Because of the turn-off of two transistors, output signal Vout becomes logical "1". Conversely, one of input signals A and B is logical "1", and the other one is logical "0", either transistors 12 and 14 or transistors 13 and 15 will be turned on. Because of the turn-on of two transistors, output signal Vout becomes logical "0". Thus, in this circuit, output signal Vout is the exclusive OR signal of input signals A and B. All the transistors mentioned above are of enhancement type.

Figure 11:
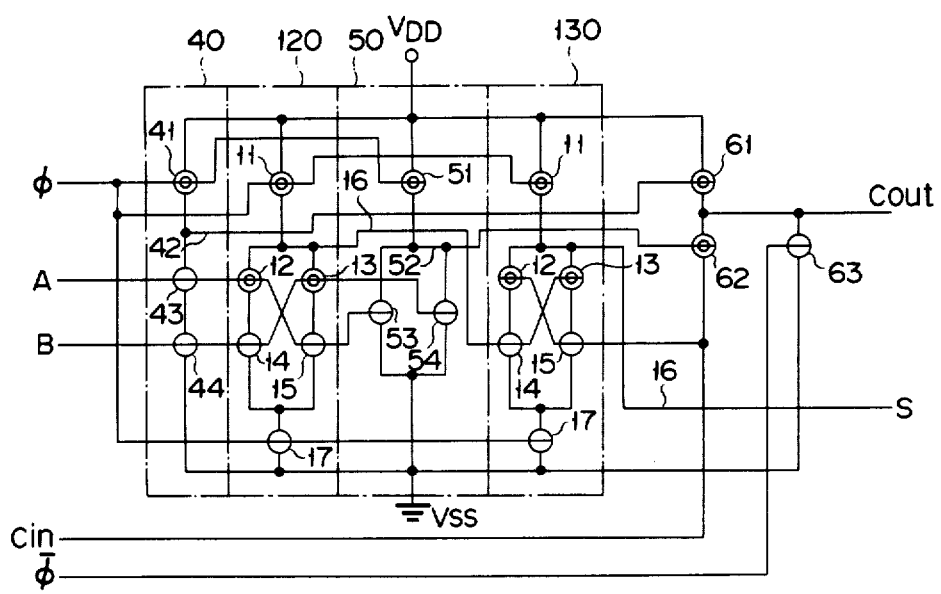
FIG. 11 is a circuit diagram of yet another embodiment of a logic arithmetic circuit according to the present invention, which corresponds to the logic arithmetic circuit shown in FIG. 9.

FIG. 11 shows a circuit diagram of a full-adder circuit constructed using the exclusive NOR circuit shown in FIG. 10. This circuit corresponds to that of FIG. 5. In FIG. 11, reference numerals 120 and 130 designate exclusive NOR circuits constructed like the FIG. 10 circuit. Numeral 40 designates a dynamic type NAND gate circuit. Numeral 50 designates a dynamic type NOR gate circuit.

Numeral 40 denotes a dynamic type NAND gate circuit. In NAND gate circuit 40, high potential $V_{DD}$ is connected to the first terminal of P-channel MOS transistor 41. The gate of transistor 41 is supplied with clock signal $\bar{\phi}$, which is reverse in phase with respect to clock signal $\phi$, as a synchronization signal. The second terminal of transistor 41 serves as output terminal 42. Output terminal 42 is connected to the first terminal of N-channel MOS transistor 43. The gate of transistor 43 is supplied with operand input signal A. The second terminal of transistor 43 is connected to the first terminal of N-channel MOS transistor 44. The gate of transistor 44 is supplied with operand input signal B. The second terminal of transistor 44 is connected to low potential $V_{SS}$.

In exclusive NOR circuit 120, high potential $V_{DD}$ is connected to the first terminal of P channel MOS transistor 11. The gate of transistor 11 is supplied with clock signal $\phi$ as a synchronization signal. The second terminal of transistor 11 is connected to the first terminal of P-channel MOS transistor 12. The gate of transistor 12 is supplied with operand input signal A. The second terminal of transistor 11 is also connected to the first terminal of P-channel MOS transistor 13. The gate of transistor 13 is supplied with operand input signal B. The second terminal of transistor 12 is connected to the first terminal of N-channel MOS transistor 14. The gate of transistor 14 is supplied with operand input signal B. The second terminal of transistor 13 is connected to the first terminal of N-channel MOS transistor 15. The gate of transistor 15 is supplied with operand input signal A. The first terminals of P-channel transistors 12 and 13 are both connected to output terminal 16 of exclusive NOR circuit 120. Inserted between the second terminals of N-channel transistors 14 and 15, on the one hand, and low potential $V_{SS}$, on the other hand, is N-channel MOS transistor 17. The gate of transistor 17 is supplied with clock signal $\bar{\phi}$.

Numeral 50 denotes a dynamic type NOR gate circuit. In NOR gate circuit 50, high potential $V_{DD}$ is connected to the first terminal of P-channel MOS transistor 51. The gate of transistor 51 is supplied with clock signal $\phi$ as a synchronization signal. The second terminal of transistor 51 serves as output terminal 52. Output terminal 52 is connected to the first terminals of two N-channel MOS transistors 53 and 54. Of those transistors, the gate of transistor 53 is supplied with operand input signal A, and the gate of transistor 54 is supplied with operand input signal B. The second terminals of transistors 53 and 54 are both connected to low potential $V_{SS}$.

In exclusive NOR circuit 130, high potential $V_{DD}$ is connected to the first terminal of P-channel MOS transistor 11. The gate of transistor 11 is supplied with clock signal $\phi$ as a synchronization signal. The second terminal of transistor 11 is connected to the first terminal of P-channel MOS transistor 12. The gate of transistor 12 is supplied with carry signal Cin from a lower-order digit. The second terminal of transistor 11 is also connected to the first terminal of P-channel MOS transistor 13. The gate of transistor 13 is supplied with an output signal of exclusive NOR circuit 120. The second terminal of transistor 12 is connected to the first terminal of N-channel MOS transistor 14. The gate of transistor 14 is supplied with an output signal of exclusive NOR circuit 120. The second terminal of transistor 13 is connected to the first terminal of N-channel MOS transistor 15. The gate of transistor 15 is supplied with carry signal Cin from a lower-order digit. The first terminals of P-channel transistors 12 and 13 are both connected to output terminal 16 of exclusive NOR circuit 130. The output terminal 16 of exclusive NOR circuit 130 forms an output terminal of the complete circuit of FIG. 11, where output signal S is provided. Inserted between the second terminals of N-channel transistors 14 and 15, on the one hand, and low potential $V_{SS}$, on the other hand, is N-channel MOS transistor 17. The gate of transistor 17 is supplied with clock signal $\phi$.

P-channel MOS transistor 61 is inserted between $V_{DD}$ and carry signal Cout to higher-order digit. The gate of transistor 61 is supplied with the signal of output terminal 42 of NAND gate circuit 40. P-channel MOS transistor 62 is inserted between carry signal Cout and carry signal Cin from lower-order digit. The gate of transistor 62 is supplied with the signal of output terminal 52 of NOR gate circuit 50. N channel MOS transistor 63 is inserted between carry signal Cout and $V_{SS}$. The gate of transistor 63 is supplied with clock signal $\bar{\phi}$. A circuit equivalent to the FIG. 11 circuit thus-arranged will be shown in FIG. 12. All of the transistors employed in the FIG. 5 circuit are of enhancement type. Operand input signals A and B are respectively applied to the two input terminals of each of NAND gate circuit 40, NOR gate circuit 50, and exclusive OR gate circuit 20. The output signal of NAND gate circuit 40 is input to the gate of transistor 61. The output signal of NOR gate circuit 50 is input to the gate of transistor 62. The output signal of exclusive NOR gate circuit 120 is input to the first input terminal of exclusive NOR gate circuit 130. Carry signal Cin from a lower-order digit is input to the other input terminal of exclusive NOR gate circuit 130. The output signal of exclusive NOR gate circuit 130 serves as operated output signal S.

In the circuit shown in FIG. 11, when clock signal $\phi$ is logical "0" and $\bar{\phi}$ is logical "1", the transistor 11 in each of the exclusive NOR circuits 120 and 130 is turned on, and the exclusive NOR circuits are thus set in the precharge mode. At this time, the signals at the output terminals 16 of the exclusive NOR circuits 120 and 130 are logical "1". Accordingly, the calculated output signal S at the output terminal of the arithmetic circuit is logical "1". When clock signal $\phi$ is logical "0" and signal $\bar{\phi}$ is logical "1", transistor 41 in NAND gate circuit 40 and transistor 51 in NOR gate circuit 50 are also turned on, and the precharge mode is set up. Then, output terminals 42 and 52 are both at $V_{DD}$ level, i.e. logical "1". As a result, transistors 61 and 62 are both turned off. N-channel transistor 63, whose gate is supplied with logical "1" clock signal $\phi$, is turned on, so that carry signal Cout to the higher-order digit is also logical "0".

Coneversely, when clock signal $\bar{\phi}$ is logical "1" and clock signal $\bar{\phi}$ is logical "0", this arithmetic circuit is in the operation mode. When in this mode, output terminal 42 in NAND gate circuit 40 and output terminal 52 in NOR gate circuit 50 respectively, having been precharged to logical "1", are discharged to become logical "0", or are not discharged, to thereby remain at logical "1", according to the logical levels of operand signals A and B. In this operational manner, a NAND logical signal of operand input signals A and B is output from output terminal 42, and a NOR logical signal of operand input signals A and B is output from output terminal 52.

When clock signal $\phi$ is logical "1" and clock signal $\bar{\phi}$ is logical "0", the transistors 11 of exclusive NOR circuits 120 and 130 are turned off. In circuit 120, the signal resulting from exclusively NORing operand input signals A and B appears at the output terminal 16 of circuit 120. In exclusive NOR circuit 130, the signal at the output terminal 16 of the circuit 120 and the carry signal Cin from the lower-order digit, are exclusively NORed, and the result thereof appears at the output terminal 16 of circuit 130. This signal at the output terminal 16 of exclusive NOR circuit 130 is used as the operated output signal S.

The carry signal Cout to the higher-order digit, being precharged to $V_{SS}$ via N-channel MOS transistor 63, is set to either logical "1" or "0". This level-setting is performed by turning on or off the P-channel MOS transistors 61 and 62, according to the output signals of NAND gate circuit 40 and NOR gate circuit 50.

While in the operation mode, when operand input signals A and B and carry signal Cin are all logical "1", the output signal of exclusive NOR circuit 120 is logical "1". At this time, the calculated output signal S of exclusive NOR circuit 130, which is supplied with the logical "1" output signal of exclusive OR circuit 120 and the carry signal Cin, is logical "1". The output signals of the NAND gate circuit 40 and the NOR gate circuit 50 are both logical "0". As a result, P-channel MOS transistors 61 and 62 are turned on, and the carry signal Cout is logical "1". This state is illustrated in the bottom line of the truth table of FIG. 3. Thus, the FIG. 11 circuit produces the operated output signal S and the carry signal Cout to the higher-order digit, according to the logical states of operand input signals A and B and the carry signal Cin, as is shown in the truth table.

As can be seen from the foregoing, the circuit of FIG. 11 operates as a binary full-adder circuit. The elements used in this circuit are 10 P-channel transistors, and 11 N-channel transistors, giving a total of 21 elements. As has been described above, the FIG. 1 and FIG. 2 circuits of the prior art devices require 32 and 30 elements respectively, while the circuit of the present invention requires only 21 elements. It can be clearly seen from this that a saving of approximately 30% in the number of circuit elements is attainable in the above-mentioned embodiment.

FIG. 12 shows a circuit equivalent to the FIG. 11 circuit. The operand input signals A and B are input to the input terminals of each of NAND gate circuit 50, NOR gate circuit 40, and exclusive NOR gate circuit 120. The output signal of NAND gate circuit 50 is input to the gate of transistor 61. The output signal of NOR gate circuit 40 is input to the gate of transistor 62. The output signal of exclusive NOR gate circuit 120 is input to the first input terminal of NOR gate circuit 130. The second input terminal of exclusive OR gate circuit 130 is supplied with carry signal Cin from the lower-order digit. The output signal of exclusive NOR gate circuit 130 is used as the calculated output signal S.

Figure 14:
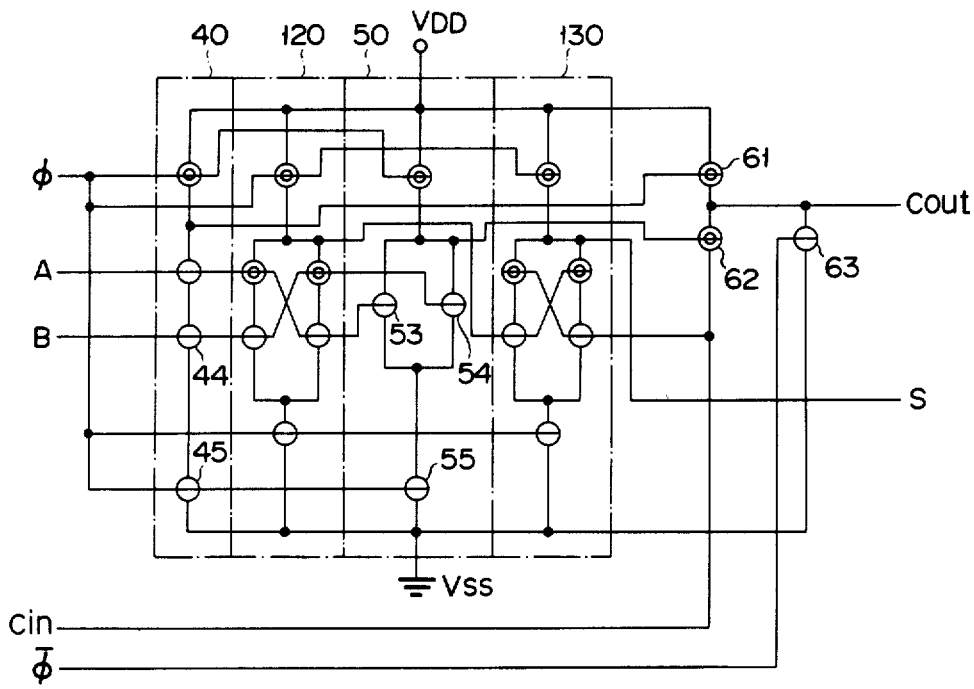
Figure 15:
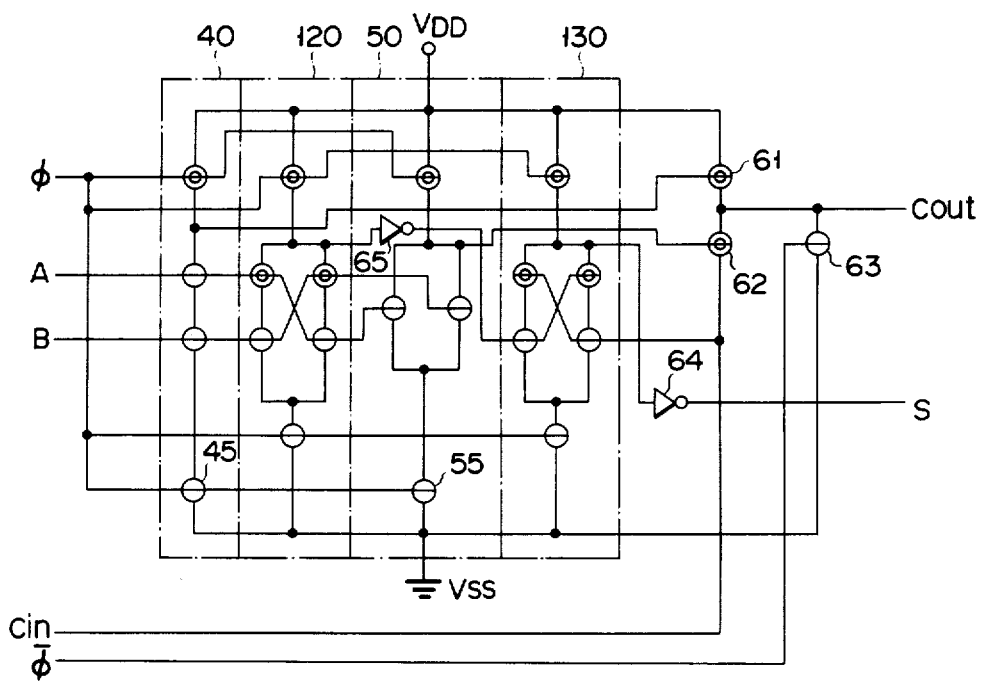

FIGS. 13 to 15 show full-adder circuits including the logic arithmetic circuits shown in FIG. 10. These circuits correspond to those in FIGS. 7 to 9. In FIGS. 13 to 15, reference numerals 120 and 130 designate NOR gate circuits; 40 a dynamic type NAND gate circuit; 50 a dynamic type NOR gate circuit. Exclusive NOR gate circuits 120 and 130 are used in place of gate circuits 20 and 30 in the embodiments of FIGS. 7 to 9. Therefore, the logical states of the output signals of gate circuits 120 and 130 are reversed with regard to those of the output signals of gate circuits 20 and 30 in the embodiments of FIGS. 7 to 9. The operation and the effects of these circuits are comparable with those of the above-mentioned embodiments.

In the embodiment of FIG. 13, in order to improve the load drive ability of the calculated output signal S, inverter 64 is inserted between the output terminal 16 of exclusive NOR circuit 130 and the calculated output signal S. By using the inverter, the logical level of signal S is the inverse of that of FIG. 11. To eliminate the difference in the logical levels of signal S, inverter 65 is inserted between the output terminal of exclusive NOR circuit 120 and the gate of transistor 14 of exclusive NOR circuit 130. This modification requires 4 transistors more than those of the FIG. 11 embodiment. The number of transistors used is, however, still much smaller than in the prior art. In this embodiment, the same numerals are used for designating corresponding portions in FIG. 11.

In the modification of FIG. 14, N-channel MOS transistors 45 and 55 are provided. Specifically, MOS transistor 45 is inserted between transistor 44 of NAND gate circuit 40 and $V_{SS}$, and MOS transistor 55 is inserted between transistors 53 and 54 of NOR gate circuit 50, on the one hand, and $V_{SS}$, on the other hand. Clock signal $\phi$ is applied to the gates of these transistors.

With such an arrangement, in gate circuits 40 and 50, during a period in which transistors 41 and 51 are turned on, and output terminals 42 and 52 are precharged, transistors 45 and 55 are placed in the off state. Therefore, even if operand input signals A and B are set at any level during this precharge period, DC current never flows between potentials $V_{DD}$ and $V_{SS}$. This modification requires two transistors more than in the FIG. 11 embodiment. It should be noted, however, that a large reduction in power consumption can be attained in this embodiment. In this embodiment, the same numerals are used for designating corresponding portions in FIG. 11.

In the modification of FIG. 15, inverters 64 and 65 of the FIG. 13 embodiment and the N-channel MOS transistors 45 and 55 of the FIG. 14 embodiment are applied to the FIG. 11 embodiment. This embodiment requires an increased number of elements, but attains the effects of both the FIG. 13 and FIG. 14 embodiments. In this embodiment, the same numerals are used for designating corresponding portions in FIG. 11.

As has been described above, this invention successfully provides a synchronizing type logic arithmetic circuit requiring a reduced number of circuit elements.

What is claimed is:

1. A logic arithmetic circuit comprising:
    a first transistor of a first polarity type whose control terminal is supplied with a synchronizing signal, one terminal of an output current path of said first transistor being connected to a high potential;
    second and third transistors of said first polarity type whose control terminals are supplied with first and second operand signals, respectively, one terminal of an output current path of each of said second and third transistors being connected to the other terminal of said output current path of said first transistor;
    a fourth transistor, of a second polarity type, whose control terminal is supplied with said second signal, one terminal of an output current path of said fourth transistor being connected to the other terminal of said output current path of said second transistor;
    a fifth transistor, of said second polarity type, whose control terminal is supplied with said first signal, one terminal of the output current path of said fifth transistor being connected to the other terminal of said output current path of said third transistor, and the other terminal of said output current path of said fifth transistor being connected to the other terminal of said output current path of said fourth transistor;

a sixth transistor, of said second polarity type, whose control terminal is supplied with said synchronizing signal, one terminal of an output current path of said sixth transistor being connected to a low potential, and the other terminal of said output current path of said sixth transistor being connected to said other terminals of said output current paths of said fourth and sixth transistors; and an output terminal, for providing an output signal, connected to one of said one terminal of said output current path of said fifth transistor and said other terminal of said output current path of said first transistor.

2. A logic arithmetic circuit comprising a first exclusive OR gate circuit, a second exclusive OR gate circuit, a NAND gate circuit, a NOR gate circuit, a further logic circuit, arithmetic output means for providing an arithmetic output signal, and carry output means for providing a carry signal to a higher-order digit, in which, said first exclusive OR gate circuit comprises:

a first transistor of a first polarity type whose control terminal is supplied with a first synchronizing signal, one terminal of an output current path of said first transistor being connected to a high potential;

second and third transistors of said first polarity type whose control terminals are supplied with first and second operand signals, respectively, one terminal of an output current path of each of said second and third transistors being connected to the other terminal of said output current path of said first transistor;

a fourth transistor, of a second polarity type, whose control terminal is supplied with said second signal, one terminal of an output current path of said fourth transistor being connected to the other terminal of said output current path of said second transistor;

a fifth transistor, of said second polarity type, whose control terminal is supplied with said first signal, one terminal of the output current path of said fifth transistor being connected to the other terminal of said output current path of said third transistor, and the other terminal of said output current path of said fifth transistor being connected to the other terminal of said output current path of said fourth transistor;

a sixth transistor, of said second polarity type, whose control terminal is supplied with said first synchronizing signal, one terminal of an output current path of said sixth transistor being connected to a low potential, and the other terminal of said output current path of said sixth transistor being connected to said other terminals of said output current paths of said fourth and sixth transistors; and an output terminal, for providing an output signal, connected to the other terminal of said output current path of said sixth transistor;

said second exclusive OR gate circuit comprises:

a seventh transistor, of a first polarity type, whose control terminal is supplied with said first synchronizing signal, one terminal of an output current path of said seventh transistor being connected to said high potential;

eighth and ninth transistors, of said first polarity type, whose control terminals are supplied with a carry signal from a lower-order digit and an output signal of said first exclusive OR gate circuit, respectively, one terminal of an output current path of each of said eighth and ninth transistors being connected to the other terminal of said output current path of said seventh transistor;

a tenth transistor, of said second polarity type, whose control terminal is supplied with said output signal of said first exclusive OR gate circuit, one terminal of an output current path of said tenth transistor being connected to the other terminal of said output current path of said eighth transistor;

an eleventh transistor, of said second polarity type, whose control terminal is supplied with said carry signal from said lower-order digit, one terminal of the output current path of said eleventh transistor being connected to the other terminal of said output current path of said ninth transistor, and the other terminal of said output current path of said eleventh transistor being connected to the other terminal of said output current path of said tenth transistor;

a twelfth transistor, of said second polarity type, whose control terminal is supplied with said first synchronizing signal, one terminal of an output current path of said twelfth transistor being connected to said low potential, and the other terminal of said output current path of said twelfth transistor being connected to said other terminals of said output current paths of said tenth and eleventh transistors; and an output terminal, for providing an output signal, connected to the other terminal of said output current path of said twelfth transistor, said output terminal being connected to said arithmetic output means;

said NAND gate circuit comprises:

a thirteenth transistor, of said first polarity type, whose control terminal is supplied with a second synchronizing signal having a phase opposite to that of said first synchronizing signal, one terminal of an output current path of said thirteenth transistor being connected to said high potential;

a fourteenth transistor, of said second polarity type, whose control terminal is supplied with said first operand signal, one terminal of an output current path of said fourteenth transistor being connected to the other terminal of said output current path of said thirteenth transistor;

a fifteenth transistor, of said second polarity type, whose control terminal is supplied with said second operand signal, one terminal of an output current path of said fifteenth transistor being connected to the other terminal of said output current path of said fourteenth transistor, and the other terminal of said output current path of said fifteenth transistor being connected to said low potential; and an output terminal, for providing an output signal, connected to the other terminal of said output current path of said thirteenth transistor;

said NOR gate circuit comprises:

a sixteenth transistor, of said first polarity type, whose control terminal is supplied with said second synchronizing signal, one terminal of an output current path of said sixteenth transistor being connected to said high potential;

seventeenth and eighteenth transistors, of said second polarity type, whose control terminals are supplied with said first and second operand signals, respectively, one terminal of an output current path of each of said seventeenth and eighteenth transistors being connected to the other terminal of said output current path of said sixteenth transistor, the other terminal of said output current path of each of said seventeenth and eighteenth transistors being connected to said low potential; and an output terminal, for providing an output signal, connected to the other terminal of said output current path of said sixteenth transistor; and said further logic circuit comprises:

a nineteenth transistor, of said first polarity type, whose control terminal is supplied with said output signal of said NAND gate circuit, one terminal of an output current path of said nineteenth transistor being connected to said high potential;

a twentieth transistor, of said first polarity type, whose control terminal is supplied with said output signal of said NOR gate circuit, one terminal of an output current path of said twentieth transistor being connected to the other terminal of said output current path of said nineteenth transistor, the other terminal of said output current path of said twentieth transistor being connected to said carry signal from said lower-order digit; and a twenty-first transistor, of said second polarity type, whose control terminal is supplied with said second synchronizing signal, one terminal of an output current path of said twenty-first transistor being connected to the node of said eighteenth transistor and said nineteenth transistor, the other terminal of said output current path of said twenty-first transistor being connected to said low potential, said node of said eighteenth transistor and said nineteenth transistor being connected to said carry output means.

3. A logic arithmetic circuit according to claim 2, further comprising a first inverter circuit connected between said output terminal of said first exclusive OR gate circuit and said tenth transistor of said second exclusive OR gate circuit, for converting the logic level of said output signal of said first exclusive OR gate circuit, a second inverter circuit connected between said output terminal of said second exclusive OR gate circuit and said carry output means, for converting the logic level of said output signal of said second exclusive OR gate circuit.

4. A logic arithmetic circuit according to claim 2, further comprising a twenty-second transistor, of said second polarity type, connected between said fifteenth transistor of said NAND gate circuit and said low potential, whose gate is supplied with said second synchronizing signal, and a twenty-third transistor, of said second polarity type, connected between said seventeenth and eighteenth transistors of said NOR gate circuit means, on the one hand, and said low potential, on the other hand, whose gate is supplied with said second synchronizing signal.

5. A logic arithmetic circuit according to claim 3, further comprising a twenty-second transistor, of said second polarity type, connected between said fifteenth transistor of said NAND gate circuit and said low potential, whose gate is supplied with said second synchronizing signal, and a twenty-third transistor, of said second polarity type, connected between said seventeenth and eighteenth transistors of said NOR gate circuit means, on the one hand, and said low potential, on the other hand, whose gate is supplied with said second synchronizing signal.

* * * * *